(12) United States Patent
Sakaguchi

(10) Patent No.: US 7,391,276 B2
(45) Date of Patent: Jun. 24, 2008

(54) OSCILLATION APPARATUS CAPABLE OF COMPENSATING FOR FLUCTUATION OF OSCILLATION FREQUENCY

(75) Inventor: Makoto Sakaguchi, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 77 days.

(21) Appl. No.: 11/247,200

(22) Filed: Oct. 12, 2005

(65) Prior Publication Data

US 2006/0082419 A1    Apr. 20, 2006

(30) Foreign Application Priority Data

Oct. 20, 2004    (JP)    ............................. 2004-305107

(51) Int. Cl.
    *H03B 27/00*    (2006.01)
(52) U.S. Cl. .................. 331/57; 331/185; 331/175; 331/176
(58) Field of Classification Search ............. 331/177 V, 331/17, 57, 176, 185, 175
    See application file for complete search history.

(56) References Cited

U.S. PATENT DOCUMENTS 5,412,349 A * 5/1995 Young et al. ................... 331/34

FOREIGN PATENT DOCUMENTS

JP    2003-283305    10/2003

* cited by examiner

*Primary Examiner*—Arnold Kinkead
(74) *Attorney, Agent, or Firm*—Young & Thompson

(57) ABSTRACT

In an oscillation apparatus formed by a ring oscillator including an odd number of inverters (more than two inverters) connected in a ring, each of the inverters having one drive MOS transistor and one load MOS transistor, a constant voltage generating circuit is adapted to generate a constant voltage corresponding to a threshold voltage of the drive MOS transistor, and a voltage-to-current converting circuit is adapted to convert the constant voltage into load currents. Each of the load currents flows through the load MOS transistor of one of the inverters.

15 Claims, 3 Drawing Sheets

OSCILLATION APPARATUS CAPABLE OF COMPENSATING FOR FLUCTUATION OF OSCILLATION FREQUENCY

BACKGROUND OF THE INVENTION

1. Field of the Invention

The present invention relates to an oscillation apparatus formed by a ring oscillator including an odd number of inverters (more than two inverters) connected in a ring, each of the inverters having one drive MOS transistor and one load MOS transistor.

2. Description of the Related Art

Generally, ring oscillator incorporating oscillation apparatuses have been used in a high frequency superposing module of an optical pickup laser diode driver for reading information from an optical disk such as a digital versatile disk (DVD) or a MiniDisk (MD). In such a module, a high frequency current of several hundreds of MHz is superposed onto a laser diode drive current to reduce various laser noises, which requires a stabilization of the oscillation frequency.

In a prior art oscillation apparatus formed by a ring oscillator including an odd number of inverters (more than two inverters) connected in a ring, each of the inverters having one drive MOS transistor and one load MOS transistor, a constant current generating circuit is adapted to generate load currents, so that each of the load currents flows through the load MOS transistor of one of the inverters (see: JP-2003-283305A). This will be explained later in detail.

In the above-described prior art oscillation apparatus, however, when the threshold voltages of the drive transistors fluctuate due to the manufacturing steps such as the impurity implantation and diffusion steps, the oscillation frequency would fluctuate.

SUMMARY OF THE INVENTION

It is an object of the present invention to provide an oscillation apparatus capable of suppressing the fluctuation caused by the manufacturing steps.

According to the present invention, in an oscillation apparatus formed by a ring oscillator including an odd number of inverters (more than two inverters) connected in a ring, each of the inverters having one drive MOS transistor and one load MOS transistor, a constant voltage generating circuit is adapted to generate a constant voltage corresponding to a threshold voltage of the drive MOS transistor, and a voltage-to-current converting circuit is adapted to convert the constant voltage into load currents. Each of the load currents flows through the load MOS transistor of one of the inverters.

Also, the constant voltage generating circuit is constructed by a constant current source adapted to generate a constant current, and a diode-connected MOS transistor connected to the constant current source, the diode-connected MOS transistor having a similar characteristic to those of the drive MOS transistors.

Further, the constant voltage generating circuit further includes a resistor with a temperature coefficient connected to the diode-connected MOS transistor, so that temperature characteristics of the diode-connected MOS transistor and the resistor compensate for each other.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art oscillation apparatus will be explained with reference to FIG. 1 (see: JP-2003-283305-A).

Figure 1:
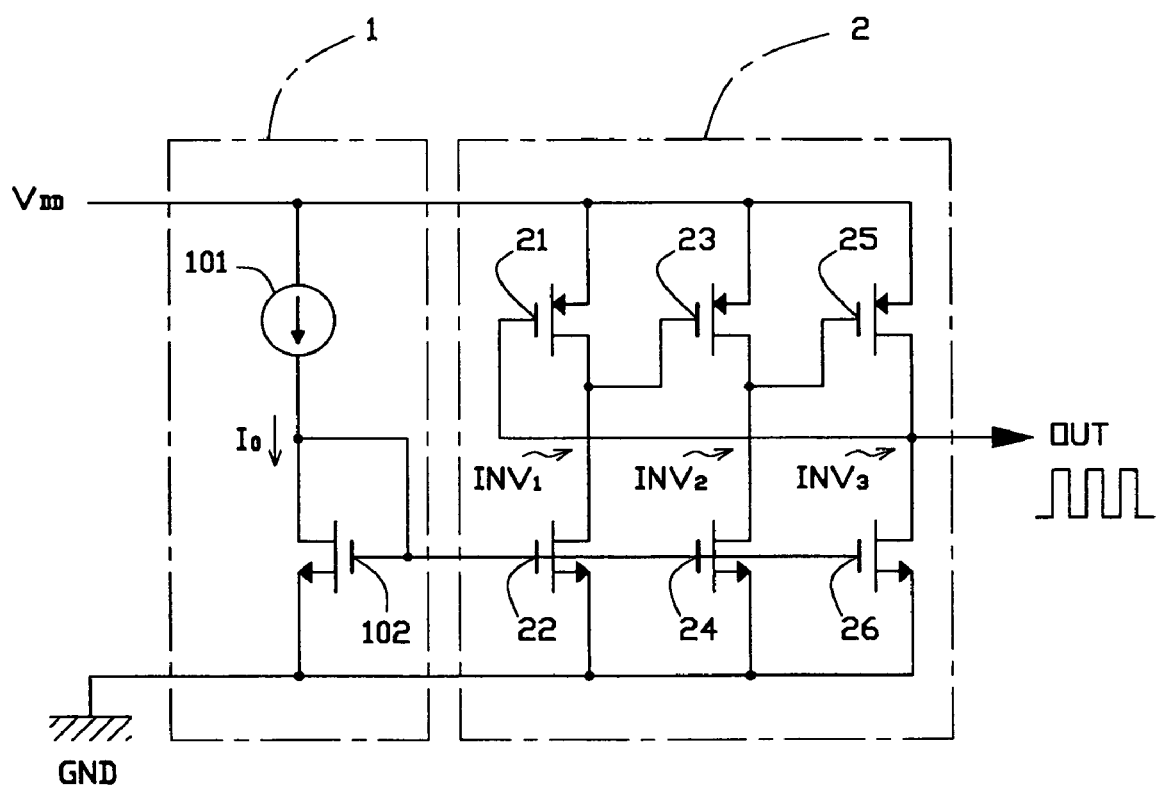
FIG. 1 is a circuit diagram illustrating a prior art oscillation apparatus.

In FIG. 1, an oscillation apparatus is constructed by a constant current circuit 1 not depending upon the temperature and a ring oscillator 2.

The constant current circuit 1 is constructed by a constant current source 101 and a drain-to-gate connected N-channel MOS transistor 102 connected in series between a power supply terminal $V_{DD}$ to which a positive voltage such as 5V is applied and a ground terminal GND to which the ground voltage is applied. Thus, a current $I_0$ determined by the constant current source 101 flows through the N-channel MOS transistor 102.

The ring oscillator 2 is constructed by an odd number of inverters (more than two inverters) connected in a ring. Each of the inverters is formed by one drive P-channel MOS transistor and one load N-channel MOS transistor connected in series between the power supply terminal $V_{DD}$ and the ground terminal GND. For example, the ring oscillator 2 is constructed by an inverter $INV_1$ formed by a drive P-channel MOS transistor 21 and a load N-channel MOS transistor 22, an inverter $INV_2$ formed by a drive P-channel MOS transistor 23 and a load N-channel MOS transistor 24, and an inverter $INV_3$ formed by a drive P-channel MOS transistor 25 and a load N-channel MOS transistor 26. The drains of the transistors 21 and 22 are connected to the gate of the drive transistor 23. Also, the drains of the transistors 23 and 24 are connected to the gate of the drive transistor 25. Further, the drains of the transistors 25 and 26 are connected to the gate of the drive transistor 21.

Each of the load transistors 22, 24 and 26 forms a current mirror circuit with the transistor 102 of the constant current circuit 1. As a result, load currents flow through the load transistors 22, 24 and 26, respectively, in accordance with the mirror ratios of the current $I_0$.

Generally, the drive P-channel MOS transistors 21, 23 and 25 have the same size, i.e., the same characteristics, and the load N-channel MOS transistor 22, 24 and 26 have the same size, i.e., the same characteristics. Also, the N-channel transistor 102 has the same gate length as those of the load N-channel MOS transistors 22, 24 and 26, but has a gate width different from those of the load N-channel MOS transistors 22, 24 and 26.

In FIG. 1, if the current $I_0$ flowing through the constant current source 101 is not affected by the temperature, the load currents flowing through the load transistors 22, 24 and 26 are always stable independent of the temperature, thus generating an output signal OUT with a stable and accurate oscillation frequency.

In FIG. 1, however, since the oscillation frequency of the output signal OUT is dependent upon the load currents flowing through the load transistors 22, 24 and 26, the input capacitances of the drive transistors 21, 23 and 25, and the threshold voltages of the drive transistors 21, 23 and 25, when the threshold voltages of the drive transistors 21, 23 and 25 fluctuate due to the manufacturing steps such as the impurity implantation and diffusion steps, the oscillation frequency of the output signal OUT would fluctuate.

Figure 2:
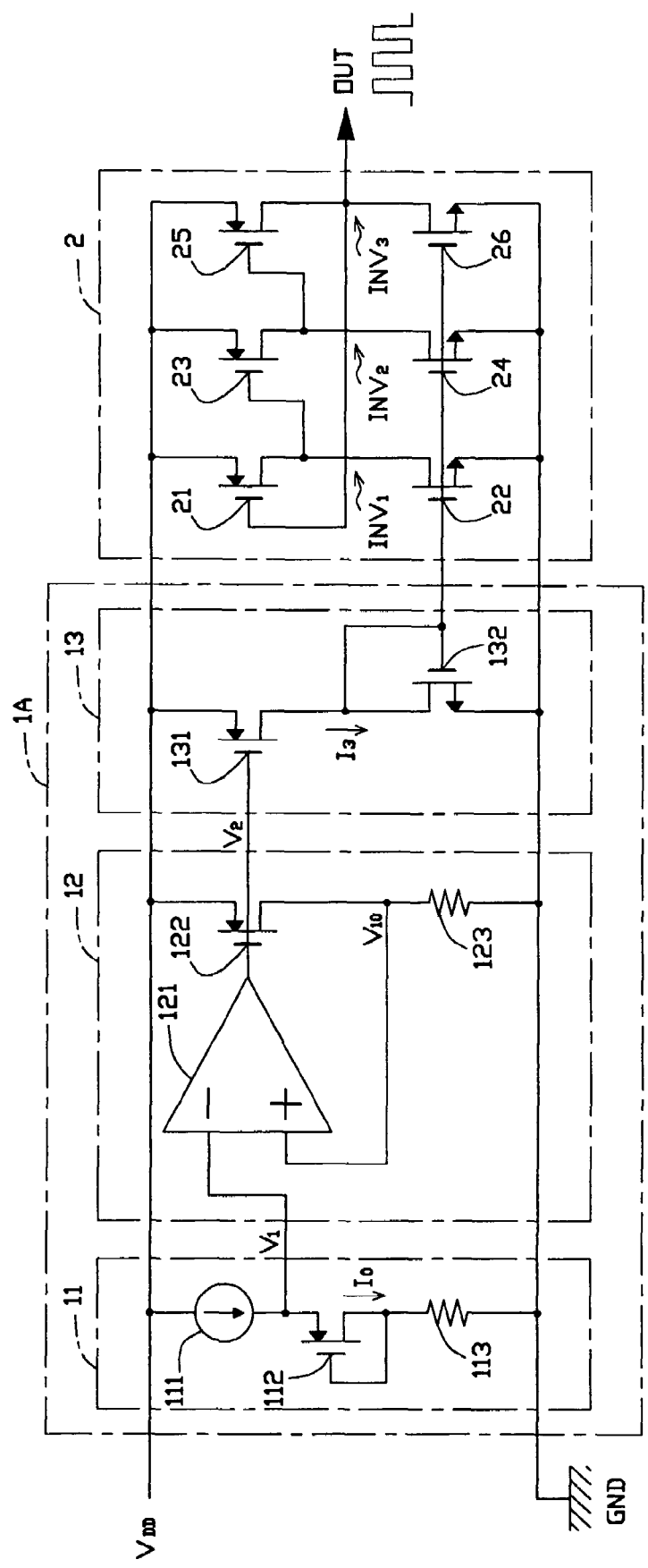
FIG. 2 is a circuit diagram illustrating a first embodiment of the oscillation apparatus according to the present invention.

In FIG. 2, which illustrates a first embodiment of the present invention, the constant current circuit 1 of FIG. 1 is replaced by a constant current circuit 1A.

The constant current circuit 1A is constructed by a constant voltage generating circuit 11, an inverting amplifier 12, and a voltage-to-current converter 13.

The constant voltage generating circuit 11 is constructed by a constant current source 111 connected to the power supply terminal $V_{DD}$, a diode-connected P-channel MOS transistor 112 whose source is connected to the constant current source 111, and a resistor 113 connected between the drain of the P-channel MOS transistor 112 and the ground terminal GND. The constant current source 111 corresponds to the constant current source 101 of FIG. 1, so that a current $I_0$ flowing through the P-channel MOS transistor 112 and the resistor 113 is not dependent upon the temperature. Also, the P-channel MOS transistor 112 has the same gate length as those of the drive transistors 21, 23 and 25, but has a different gate width from those of the drive transistors 21, 23 and 25, 50 that the turn-ON voltage of the P-channel MOS transistor 112 substantially corresponds to the absolute value of the threshold voltage $V_{thp}$ of the drive transistors 21, 23 and 25. Further, assume that, the higher the temperature, the smaller the absolute value of the threshold voltage $V_{thp}$ of the drive transistors 21, 23 and 25. In this case, the resistor 113 is formed by a positive temperature coefficient resistance such as an impurity diffusion region formed in a semiconductor substrate.

The constant voltage generating circuit 11 generates an output voltage $V_1$ from the node between the constant current source 111 and the diode-connected transistor 112. The output voltage $V_1$ of the constant voltage generating circuit 11 is amplified by the inverting amplifier 12 to generate an inverted voltage $V_2$.

The inverting amplifier 12 is constructed by an operational amplifier 121 whose inverting input receives the output voltage $V_1$ of the constant voltage generating circuit 11, and an inverter formed by a P-channel MOS transistor 122 and a resistor 123 connected in series between the power supply terminal $V_{DD}$ and the ground terminal GND. The output voltage of the operational amplifier 121 which serves as the output voltage $V_2$ is applied to the gate of the P-channel MOS transistor 122 and is fed back to the non-inverting input of the operational amplifier 121.

The voltage-to-current converter 13 is constructed by a P-channel MOS transistor 131 and a drain-to-gate connected N-channel MOS transistor 132 connected in series between the power supply terminal $V_{DD}$ and the ground terminal GND. The gate of the P-channel MOS transistor 131 is connected to the output of the inverting amplifier 12, so that a current $I_3$ flows through the P-channel MOS transistor 131 and the N-channel MOS transistor 132 in accordance with the output voltage $V_2$ of the inverting amplifier 12, i.e., in accordance with the output voltage $V_1$ of the constant voltage generating circuit 11. The P-channel MOS transistor 131 has the same gate length as that of the P-channel MOS transistor 122 but has a different gate width from that of the P-channel MOS transistor 122.

The N-channel MOS transistor 132 of the voltage-to-current converter 13 corresponds to the N-channel MOS transistor 102 of the constant voltage generating circuit 1 of FIG. 1, so that each of the load transistors 22, 24 and 26 of the ring oscillator 2 forms a current mirror circuit with the transistor 132 of the voltage-to-current converter 13. As a result, load currents flow through the load transistors 22, 24 and 26, respectively, in accordance with the mirror ratios of the current $I_3$.

The operation of the oscillation apparatus of FIG. 2, where the higher the temperature, the smaller the absolute value of the threshold voltage $V_{thp}$ of the P-channel MOS transistors, is explained next.

As stated above, even when the temperature is increased or decreased, the current $I_0$ is constant. In this case, the absolute value of the threshold voltage $V_{thp}$ of the drive P-channel MOS transistors 21, 22 and 23 is decreased or increased, so that the source-to-drain voltage (turn-ON voltage) of the P-channel MOS transistor 112 is also decreased or increased. On the other hand, since the resistance value of the resistor 113 is increased or decreased, the voltage applied thereto is increased or decreased. Therefore, if the temperature characteristics of the P-channel MOS transistor 112 and temperature characteristics of the resistor 113 are adjusted to compensate for each other, the voltage $V_1$ can be constant independent of the temperature.

In the inverting amplifier 12, since the inverting input of the operational amplifier 121 is imaginarily short-circuited to the non-inverting input of the operational amplifier 121, the voltage $V_{10}$ at the node between the P-channel MOS transistor 122 and the resistor 123 is brought close to $V_1$. In this case, the threshold voltage of the P-channel MOS transistor 122 fluctuates in accordance with the temperature, so that the voltage $V_{10}$ is constant independent of the temperature. Thus, a current flowing through the P-channel MOS transistor 122 and the resistor 123 is also constant independent of the temperature.

In the voltage-to-current converter 13, a current $I_3$ flowing through the P-channel MOS transistor 131 and the N-channel MOS transistor 132 is also constant independent of the temperature.

In the ring oscillator 2, since the load currents flowing through the load transistors 22, 24 and 26 are determined in accordance with the mirror ratios of the current $I_3$, the load currents are also constant independent of the temperature. Thus, the ring oscillator 2 can be stabilized independent of the temperature.

In FIG. 2, assume that, the higher the temperature, the larger the absolute value of the threshold voltage $V_{thp}$ of the drive transistors 21, 23 and 25. In this case, the resistor 113 is formed by a negative temperature coefficient resistance such as polycrystalline silicon formed on a semiconductor substrate. Even in this case, in the same way as explained above, the ring oscillator 2 can be stabilized independent of the temperature.

The fluctuation of the threshold voltage of the drive P-channel MOS transistors 21, 22 and 23 due to the manufacturing steps can also be compensated for.

That is, in FIG. 2, when the absolute value of the threshold voltage $V_{thp}$ of the drive P-channel MOS transistors 21, 22 and 23 is increased by the manufacturing steps, the oscillation frequency of the ring oscillator 2 is going to be decreased. In this case, the source-to-drain voltage (turn-ON voltage) of the P-channel MOS transistor 112 is also increased, so that the voltage $V_1$ of the constant current generating circuit 11 is increased.

In the inverting amplifier 12, since the inverting input of the operational amplifier 121 is imaginarily short-circuited to the non-inverting input of the operational amplifier 121, the voltage $V_{10}$ at the node between the P-channel MOS transistor 122 and the resistor 123 is increased to $V_1$. Therefore, a current flowing through the P-channel MOS transistor 122 and the resistor 123 is increased. In other words, the output voltage $V_2$ of the inverting amplifier 12 is decreased.

In the voltage-to-current converter 13, since the input voltage $V_2$ is decreased, a current $I_3$ flowing through the P-channel MOS transistor 131 and the N-channel MOS transistor 132 is increased.

In the ring oscillator 2, since the load currents flowing through the load transistors 22, 24 and 26 are determined in accordance with the mirror ratios of the current $I_3$, the load currents are also increased to suppress the decrease of the oscillation frequency of the ring oscillator 2. Thus, the oscillation frequency of the ring oscillator 2 can be stabilized at an appropriate value.

On the other hand, in FIG. 2, when the absolute value of the threshold voltage $V_{thp}$ of the drive P-channel MOS transistors 21, 22 and 23 is decreased by the manufacturing steps, the oscillation frequency of the ring oscillator 2 is going to be increased. In this case, the source-to-drain voltage (turn-ON voltage) of the P-channel MOS transistor 112 is also decreased, so that the voltage $V_1$ of the constant current generating circuit 11 is decreased.

In the inverting amplifier 12, since the inverting input of the operational amplifier 121 is imaginarily short-circuited to the non-inverting input of the operational amplifier 121, the voltage $V_{10}$ at the node between the P-channel MOS transistor 122 and the resistor 123 is decreased to $V_1$. Therefore, a current flowing through the P-channel MOS transistor 122 and the resistor 123 is decreased. In other words, the output voltage $V_2$ of the inverting amplifier 12 is increased.

In the voltage-to-current converter 13, since the input voltage $V_2$ is increased, the current $I_3$ flowing through the P-channel MOS transistor 131 and the N-channel MOS transistor 132 is decreased.

In the ring oscillator 2, since the load currents flowing through the load transistors 22, 24 and 26 are determined in accordance with the mirror ratios of the current $I_3$, the load currents are also decreased to suppress the increase of the oscillation frequency of the ring oscillator 2. Thus, the oscillation frequency of the ring oscillator 2 can be stabilized at an appropriate value.

Thus, in the first embodiment, the fluctuation of the oscillation frequency caused by the manufacturing steps can be compensated for.

Figure 3:
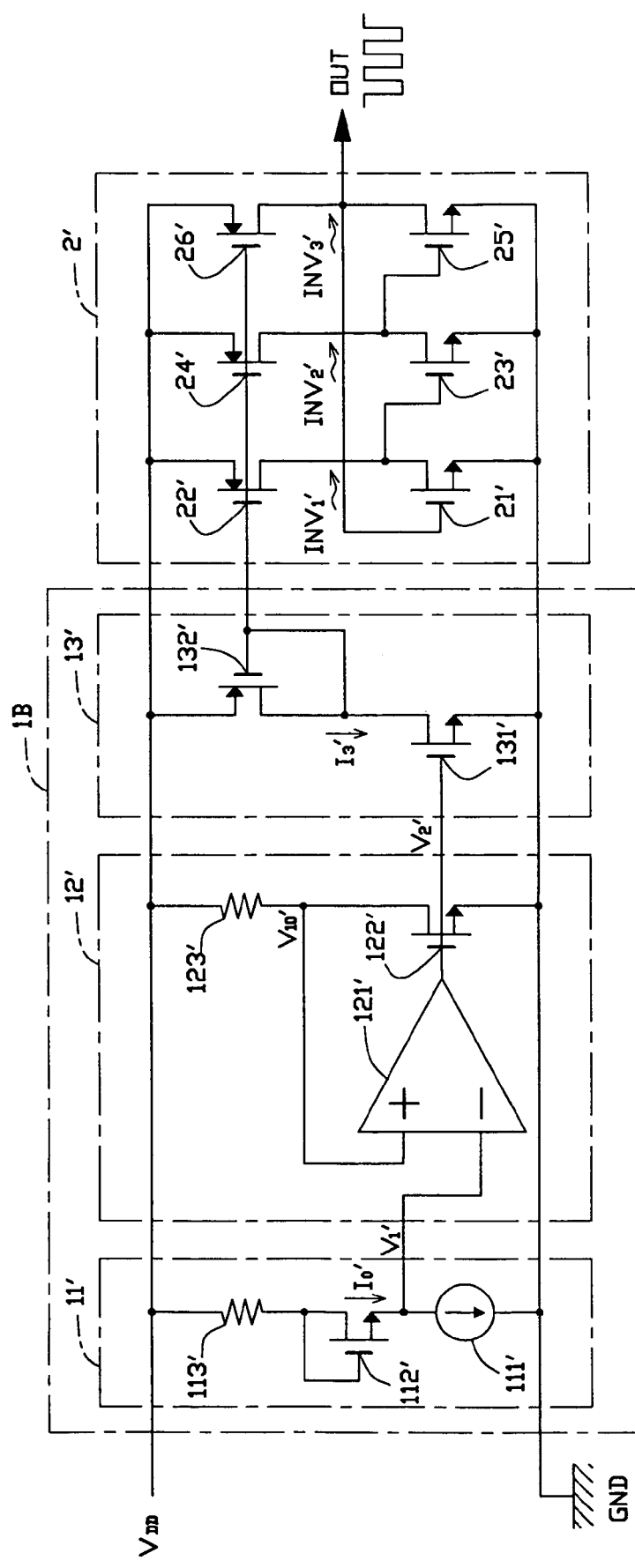
FIG. 3 is a circuit diagram illustrating a second embodiment of the oscillation apparatus according to the present invention.

In FIG. 3, which illustrates a second embodiment of the present invention, an oscillation apparatus is constructed by a constant current circuit 1B not depending upon the temperature and a ring oscillator 2'.

The ring oscillator 2' is constructed by an odd number of inverters (more than two inverters) connected in a ring. Each of the inverters is formed by one drive N-channel MOS transistor and one load P-channel MOS transistor connected in series between the ground terminal GND and the power supply terminal $V_{DD}$. For example, the ring oscillator 2' is constructed by an inverter $INV_1'$ formed by a drive N-channel MOS transistor 21' and a load P-channel MOS transistor 22', an inverter $INV_2'$ formed by a drive N-channel MOS transistor 23' and a load N-channel MOS transistor 24', and an inverter $INV_3'$ formed by a drive N-channel MOS transistor 25' and a load P-channel MOS transistor 26'. The drains of the transistors 21' and 22' are connected to the gate of the drive transistor 23'. Also, the drains of the transistors 23' and 24' are connected to the gate of the drive transistor 25'. Further, the drains of the transistors 25' and 26' are connected to the gate of the drive transistor 21'.

Generally, the drive N-channel MOS transistors 21', 23' and 25' have the same size, i.e., the same characteristics, and the load P-channel MOS transistor 22', 24' and 26' have the same size, i.e., the same characteristics.

The constant current circuit 1B is constructed by a constant voltage generating circuit 11', an inverting amplifier 12', and a voltage-to-current converter 13'.

The constant voltage generating circuit 11' is constructed by a constant current source 111' connected to the ground terminal GND, a diode-connected N-channel MOS transistor 112' whose source is connected to the constant current source 111', and a resistor 113' connected between the drain of the N-channel MOS transistor 112' and the power supply terminal $V_{DD}$. The constant current source 111' corresponds to the constant current source 101 of FIG. 1, so that a current $I_0$ flowing through the N-channel MOS transistor 112' and the resistor 113' is not dependent upon the temperature. Also, the N-channel MOS transistor 112' has the same gate length as those of the drive transistors 21', 23' and 25', but has a different gate width from those of the drive transistors 21', 23' and 25', so that the turn-ON voltage of the N-channel MOS transistor 112' substantially corresponds to the threshold voltage $V_{thn}$ of the drive transistors 21', 23' and 25'. Further, assume that, the higher the temperature, the smaller the threshold voltage $V_{thn}$ of the drive transistors 21', 23' and 25'. In this case, the resistor 113' is formed by a positive temperature coefficient resistance such as an impurity diffusion region formed in a semiconductor substrate.

The constant voltage generating circuit 11' generates an output voltage $V_1'$ from the node between the constant current source 111' and the diode-connected transistor 112'. The output voltage $V_1'$ of the constant voltage generating circuit 11' is amplified by the inverting amplifier 12' to generate an inverted voltage $V_2'$.

The inverting amplifier 12' is constructed by an operational amplifier 121' whose inverting input receives the output voltage $V_1'$ of the constant voltage generating circuit 11', and an inverter formed by an N-channel MOS transistor 122' and a resistor 123' connected in series between the ground terminal GND and the power supply terminal $V_{DD}$. The output voltage of the operational amplifier 121' which serves as the output voltage $V_2'$ is applied to the gate of the N-channel MOS transistor 122' and is fed back to the non-inverting input of the operational amplifier 121'.

The voltage-to-current converter 13' is constructed by an N-channel MOS transistor 131' and a drain-to-gate connected P-channel MOS transistor 132' connected in series between the ground terminal GND and the power supply terminal $V_{DD}$. The gate of the N-channel MOS transistor 131' is connected to the output of the inverting amplifier 12', so that a current $I_3'$ flows through the N-channel MOS transistor 131' and the P-channel MOS transistor 132' in accordance with the output voltage $V_2'$ of the inverting amplifier 12', i.e., in accordance with the output voltage $V_1'$ of the constant voltage generating circuit 11'. The N-channel MOS transistor 131' has the same gate length as that of the N-channel MOS transistor 122' but has a different gate width from that of the N-channel MOS transistor 122'.

Each of the load transistors 22', 24' and 26' of the ring oscillator 2' forms a current mirror circuit with the transistor 132' of the voltage-to-current converter 13'. As a result, load currents flow through the load transistors 22', 24' and 26', respectively, in accordance with the mirror ratios of the current $I_3'$.

The operation of the oscillation apparatus of FIG. 3, where the higher the temperature, the smaller the threshold voltage $V_{thn}$ of the N-channel MOS transistors, is explained next.

As stated above, even when the temperature is increased or decreased, the current $I_0'$ is constant. In this case, the threshold voltage $V_{thn}$ of the drive N-channel MOS transistors 21', 22' and 23' is decreased or increased, so that the source-to-drain voltage (turn-ON voltage) of the N-channel MOS transistor 112' is also decreased or increased. On the other hand, since the resistance value of the resistor 113' is increased or decreased, the voltage applied thereto is increased or decreased. Therefore, if the temperature characteristics of the N-channel MOS transistor 112' and temperature characteristics of the resistor 113' are adjusted to compensate for each other, the voltage Vi' can be constant independent of the temperature.

In the inverting amplifier 12', since the inverting input of the operational amplifier 121' is imaginarily short-circuited to the non-inverting input of the operational amplifier 121', the voltage $V_{10}$' at the node between the N-channel MOS transistor 122' and the resistor 123' is brought close to $V_1$'. In this case, the threshold voltage of the N-channel MOS transistor 122' fluctuates in accordance with the temperature, the voltage $V_{10}$' is constant independent of the temperature. Thus, a current flowing through the N-channel MOS transistor 122' and the resistor 123' is also constant independent of the temperature.

In the voltage-to-current converter 13', a current $I_3$' flowing through the N-channel MOS transistor 131' and the P-channel MOS transistor 132' is also constant independent of the temperature.

In the ring oscillator 2', since the load currents flowing through the load transistors 22', 24' and 26' are determined in accordance with the mirror ratios of the current $I_3$', the load currents are also constant independent of the temperature. Thus, the ring oscillator 2' can be stabilized independent of the temperature.

In FIG. 3, assume that, the higher the temperature, the larger the threshold voltage $V_{thn}$ of the drive transistors 21', 23' and 25'. In this case, the resistor 113' is formed by a negative temperature coefficient resistance such as polycrystalline silicon formed on a semiconductor substrate. Even in this case, in the same way as explained above, the ring oscillator 2' can be stabilized independent of the temperature.

The fluctuation of the threshold voltage of the drive N-channel MOS transistors 21', 22' and 23' due to the manufacturing steps can also be compensated for.

That is, in FIG. 3, when the absolute value of the threshold voltage $V_{thn}$ of the drive N-channel MOS transistors 21', 22' and 23' is increased by the manufacturing steps, the oscillation frequency of the ring oscillator 2' is going to be decreased. In this case, the source-to-drain voltage (turn-ON voltage) of the N-channel MOS transistor 112' is also increased, so that the voltage $V_1$' of the constant current generating circuit 11' is decreased.

In the inverting amplifier 12', since the inverting input of the operational amplifier 121' is imaginarily short-circuited to the non-inverting input of the operational amplifier 121', the voltage $V_{10}$' at the node between the N-channel MOS transistor 122' and the resistor 123' is decreased to $V_1$'. Therefore, a current flowing through the N-channel MOS transistor 122' and the resistor 123' is increased. In other words, the output voltage $V_2$' of the inverting amplifier 12' is increased.

In the voltage-to-current converter 13', since the input voltage $V_2$' is increased, a current $I_3$' flowing through the N-channel MOS transistor 131' and the P-channel MOS transistor 132' is increased.

In the ring oscillator 2', since the load currents flowing through the load transistors 22', 24' and 26' are determined in accordance with the mirror ratios of the current $I_3$', the load currents are also increased to suppress the decrease of the oscillation frequency of the ring oscillator 2'. Thus, the oscillation frequency of the ring oscillator 2' can be stabilized at an appropriate value.

On the other hand, in FIG. 3, when the absolute value of the threshold voltage $V_{thn}$ of the drive N-channel MOS transistors 21', 22' and 23' is decreased by the manufacturing steps, the oscillation frequency of the ring oscillator 2' is going to be increased. In this case, the source-to-drain voltage (turn-ON voltage) of the N-channel MOS transistor 112' is also decreased, so that the voltage $V_1$' of the constant current generating circuit 11' is increased.

In the inverting amplifier 12', since the inverting input of the operational amplifier 121' is imaginarily short-circuited to the non-inverting input of the operational amplifier 121', the voltage $V_{10}$' at the node between the N-channel MOS transistor 122' and the resistor 123' is increased to $V_1$'. Therefore, a current flowing through the N-channel MOS transistor 122' and the resistor 123' is decreased. In other words, the output voltage $V_2$' of the inverting amplifier 12' is decreased.

In the voltage-to-current converter 13', since the input voltage $V_2$' is decreased, the current $I_3$ flowing through the N-channel MOS transistor 131' and the P-channel MOS transistor 132' is increased.

In the ring oscillator 2', since the load currents flowing through the load transistors 22', 24' and 26' are determined in accordance with the mirror ratios of the current $I_3$, the load currents are also decreased to suppress the increase of the oscillation frequency of the ring oscillator 2'. Thus, the oscillation frequency of the ring oscillator 2' can be stabilized at an appropriate value.

Thus, even in the second embodiment, the fluctuation of the oscillation frequency caused by the manufacturing steps can be compensated for.

The oscillation apparatuses of FIGS. 2 and 3 can be incorporated into one large scale integrated (LSI) circuit chip; in this case, note that the resistors 123 and 123' can be externally provided from the LSI circuit chip so that the oscillation frequency can be easily adjusted by changing the resistance values of the resistors 123 and 123'.

The invention claimed is:

1. An oscillation apparatus comprising:
    a ring oscillator including an odd number of inverters comprising more than two inverters connected in a ring, each of said inverters comprising one drive MOS transistor and one load MOS transistor;
    a constant voltage generating circuit adapted to generate a constant voltage corresponding to a threshold voltage of said drive MOS transistor; and
    a voltage-to-current converting circuit, connected to said constant voltage generating circuit, said voltage-to-current converting circuit being adapted to convert said constant voltage into load currents, an output of said voltage-to-current converting circuit being connected to a gate of said load MOS transistor of each of said inverters, and each of said load currents flowing through the load MOS transistor of one of said inverters.

2. The oscillation apparatus as set forth in claim 1, wherein said constant voltage generating circuit comprises:
    a constant current source adapted to generate a constant current; and
    a diode-connected MOS transistor connected to said constant current source, said diode-connected MOS transistor having a similar characteristic to those of said drive MOS transistors.

3. An oscillation apparatus comprising:
    a ring oscillator including an odd number of inverters comprising more than two inverters connected in a ring, each of said inverters comprising one drive MOS transistor and one load MOS transistor;
a constant voltage generating circuit adapted to generate a constant voltage corresponding to a threshold voltage of said drive MOS transistor; and
a voltage-to-current converting circuit, connected to said constant voltage generating circuit, said voltage-to-current converting circuit being adapted to convert said constant voltage into load currents, each of said load currents flowing through the load MOS transistor of one of said inverters,
wherein said constant voltage generating circuit comprises a constant current source adapted to generate a constant current, and a diode-connected MOS transistor connected to said constant current source, said diode-connected MOS transistor having a similar characteristic to those of said drive MOS transistors, and
wherein said constant voltage generating circuit further comprises a first resistor with a temperature coefficient connected to said diode-connected MOS transistor, so that temperature characteristics of said diode-connected MOS transistor and said first resistor compensate for each other.

4. An oscillation apparatus comprising:
a ring oscillator including an odd number of inverters comprising more than two inverters connected in a ring, each of said inverters comprising one drive MOS transistor and one load MOS transistor;
a constant voltage generating circuit adapted to generate a constant voltage corresponding to a threshold voltage of said drive MOS transistor; and
a voltage-to-current converting circuit, connected to said constant voltage generating circuit, said voltage-to-current converting circuit being adapted to convert said constant voltage into load currents, each of said load currents flowing through the load MOS transistor of one of said inverters,
wherein said voltage-to-current converting circuit comprises:
an inverting amplifier connected to said constant voltage generating circuit, said inverting amplifier being adapted to invert and amplify said constant voltage to generate an inverted voltage; and
a voltage-to-current converter connected to an output of said inverting amplifier, said voltage-to-current converter being adapted to convert said inverted voltage into said load currents.

5. The oscillation apparatus as set forth in claim 4, wherein said inverting amplifier comprises:
an operational amplifier having an inverting input connected to an output of said constant voltage generating circuit;
a first MOS transistor having a gate connected to an output of said operational amplifier and a drain connected to a non inverting input of said operational amplifier; and
a second resistor connected to the drain of said first MOS transistor.

6. The oscillation apparatus as set forth in claim 5, wherein said second resistor is externally provided, so that an oscillation frequency can be adjusted by changing a resistance value of said second resistor.

7. The oscillation apparatus as set forth in claim 5, wherein said voltage-to-current converter comprises:
a second MOS transistor having a similar characteristic to that of said first MOS transistor, and having a gate connected to an output of said inverting amplifier; and a third MOS transistor having a similar characteristic to those of said load MOS transistors and forming a mirror circuit with each of said load MOS transistors.

8. An oscillation apparatus comprising:
a first power supply terminal adapted to receive a first voltage;
a second power supply terminal adapted to receive a second voltage lower than said first voltage;
a ring oscillator including an odd number of inverters comprising more than two inverters connected in a ring, each of said inverters comprising one drive P-channel MOS transistor with a source connected to said first power supply terminal and one load N-channel MOS transistor with a source connected to said second power supply terminal and a drain connected to a drain of said drive P-channel MOS transistor;
a constant voltage generating circuit including a constant current source with a first end connected to said first power supply terminal, and a diode-connected P-channel MOS transistor and a first resistor connected in series between a second end of said constant current source and said second power supply terminal;
an inverting amplifier including an operational amplifier with an inverting input connected to the second end of said constant current source, a first P-channel MOS transistor with a source connected to said first power supply terminal, a gate connected to an output of said operational amplifier and a drain connected to a non-inverting input of said operational amplifier, and a second resistor connected between the drain of said first P-channel MOS transistor and said second power supply terminal; and
a voltage-to-current converter including a second P-channel MOS transistor with a source connected to said first power supply terminal and a gate connected to the output of said operational amplifier, and an N-channel MOS transistor with a drain and a gate connected to the drain of said second P-channel MOS transistor and gates of said load N-channel MOS transistors and a source connected to said second power supply terminal.

9. The oscillation apparatus as set forth in claim 8, wherein said first resistor has a temperature coefficient, so that temperature characteristics of said diode-connected P-channel MOS transistor and said first resistor compensate for each other.

10. The oscillation apparatus as set forth in claim 8, wherein said second resistor is externally provided, so that an oscillation frequency can be adjusted by changing a resistance value of said second resistor.

11. An oscillation apparatus comprising:
a first power supply terminal adapted to receive a first voltage;
a second power supply terminal adapted to receive a second voltage lower than said first voltage;
a ring oscillator including an odd number of inverters comprising more than two inverters connected in a ring, each of said inverters comprising one drive N-channel MOS transistor with a source connected to said second power supply terminal and one load P-channel MOS transistor with a source connected to said first power supply terminal and a drain connected to a drain of said drive N-channel MOS transistor;
a constant voltage generating circuit including a constant current source with a first end connected to said second power supply terminal, and a diode-connected N-channel MOS transistor and a first resistor connected in series between a second end of said constant current source and said first power supply terminal;

an inverting amplifier including an operational amplifier with an inverting input connected to the second end of said constant current source, a first N-channel MOS transistor with a source connected to said second power supply terminal, a gate connected to an output of said operational amplifier and a drain connected to a non-inverting input of said operational amplifier, and a second resistor connected between the drain of said first N-channel MOS transistor and said first power supply terminal; and a voltage-to-current converter including a second N-channel MOS transistor with a source connected to said second power supply terminal and a gate connected to the output of said operational amplifier, and a P-channel MOS transistor with a drain and a gate connected to the drain of said second N-channel MOS transistor and gates of said load P-channel MOS transistors and a source connected to said first power supply terminal.

12. The oscillation apparatus as set forth in claim 11, wherein said first resistor has a temperature coefficient, so that temperature characteristics of said diode-connected N-channel MOS transistor and said first resistor compensate for each other.

13. The oscillation apparatus as set forth in claim 11, wherein said second resistor is externally provided, so that an oscillation frequency can be adjusted by changing a resistance value of said second resistor.

14. The oscillation apparatus as set forth in claim 2, wherein said diode-connected MOS transistor in said constant voltage generating circuit is of the same conductivity type as that of said drive MOS transistors in said ring oscillator.

15. The oscillation apparatus as set forth in claim 14, wherein said diode-connected MOS transistor in said constant voltage generating circuit has a turn-ON voltage that substantially corresponds to an absolute value of a threshold voltage of said drive MOS transistors in said ring oscillator.

* * * * *